(12) United States Patent  
Dunn et al.

(10) Patent No.: US 6,953,227 B2
(45) Date of Patent: Oct. 11, 2005

(54) HIGH-POWER MULTI-DEVICE LIQUID COOLING

(75) Inventors: John Dunn, Peabody, MA (US); Shlomo Novotny, Wayland, MA (US); Marlin Vogel, Brentwood, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 149 days.

(21) Appl. No.: 10/310,583

(22) Filed: Dec. 5, 2002

(65) Prior Publication Data

US 2004/0109290 A1 Jun. 10, 2004

(51) Int. Cl.[7] .................................................. H05K 7/20
(52) U.S. Cl. ....................... 301/699; 361/701; 361/702; 165/80.4; 257/713; 257/714
(58) Field of Search .................... 62/259.2; 165/80.3, 165/80.4, 104.33; 257/714, 715; 137/593; 174/15.1, 17.06, 17 LF; 361/698, 699, 700, 701, 702, 704, 715–719; 220/565, 723

(56) References Cited

U.S. PATENT DOCUMENTS

| | | | |
|---|---|---|---|
| 2,012,527 A | | 8/1935 | Batchelder |
| 2,675,228 A | | 4/1954 | Baird et al. |
| 3,571,677 A | * | 3/1971 | Oeschger .................... 361/279 |
| 4,138,692 A | * | 2/1979 | Meeker et al. |
| 4,558,395 A | * | 12/1985 | Yamada et al. ............. 361/699 |
| 4,665,466 A | | 5/1987 | Green |
| 4,721,996 A | * | 1/1988 | Tustaniwskyj et al. ..... 257/713 |
| 4,729,424 A | | 3/1988 | Mizuno |
| 4,733,331 A | * | 3/1988 | Chauvet ...................... 361/700 |
| 4,791,983 A | * | 12/1988 | Nicol et al. ................. 165/80.4 |
| 4,809,134 A | * | 2/1989 | Tustaniwskyj et al. ..... 361/699 |
| 4,870,477 A | * | 9/1989 | Nakanishi et al. .......... 257/713 |
| 4,882,654 A | * | 11/1989 | Nelson et al. ............... 361/701 |
| 4,977,444 A | * | 12/1990 | Nakajima et al. ........... 257/714 |
| 5,144,531 A | * | 9/1992 | Go et al. ..................... 361/702 |
| 5,166,863 A | * | 11/1992 | Shmunis ...................... 361/699 |
| 5,177,667 A | * | 1/1993 | Graham et al. ............. 361/715 |
| 5,183,104 A | | 2/1993 | Novotny |
| 5,323,847 A | * | 6/1994 | Koizumi et al. ........ 165/104.33 |
| 5,406,807 A | | 4/1995 | Ashiwake |
| 5,465,192 A | * | 11/1995 | Allen et al. ................. 361/705 |
| 5,535,094 A | | 7/1996 | Nelson |
| 5,675,473 A | * | 10/1997 | McDunn et al. ............ 361/699 |
| 5,701,045 A | | 12/1997 | Yokozawa |
| 5,706,668 A | | 1/1998 | Hilpert |
| 5,912,802 A | | 6/1999 | Nelson |
| 5,940,269 A | | 8/1999 | Ko |
| 6,029,742 A | | 2/2000 | Burward-Hoy |
| 6,050,327 A | | 4/2000 | Gates |
| 6,125,924 A | | 10/2000 | Lin |

(Continued)

OTHER PUBLICATIONS

"Protection for Today's Needs . . . And Tomorrow's Opportunities", Liebert Foundation, US.

*Primary Examiner*—Michael Datskovsky
(74) *Attorney, Agent, or Firm*—Kudirka & Jobse, LLP

(57) ABSTRACT

A cooling system is presented. The system includes a cooling circuit and at least one electronic component coupled to a surface. One or more heat dissipation structures are in thermal contact with the at least one electronic component. At least one sliding seal mechanism is coupled to the cooling circuit and the one or more heat dissipation structures so as to provide fluid communication between the cooling circuit and the one or more heat dissipation structures. The cooling circuit may include a tank that has a volumetric center and that is capable of holding a maximum volume of fluid. Fluid enters the tank through a tank input and exits the tank through a tank output. The tank output has a port through which fluid from the tank enters the tank output. The tank is capable of being filled with a fluid volume that is less than the maximum volume of fluid, such that the port remains immersed in fluid irrespective of tank orientation.

6 Claims, 2 Drawing Sheets

U.S. PATENT DOCUMENTS

| | | |
|---|---|---|
| 6,130,820 A | 10/2000 | Konstad |
| 6,135,200 A | 10/2000 | Okochi |
| 6,137,680 A | 10/2000 | Kodaira |
| 6,205,803 B1 | 3/2001 | Scaringe |
| 6,213,194 B1 | 4/2001 | Chrysler |
| 6,313,990 B1 * | 11/2001 | Cheon ........................ 361/699 |
| 6,396,697 B1 | 5/2002 | Chen |
| 6,438,984 B1 | 8/2002 | Novotny |
| 6,526,768 B2 * | 3/2003 | Wall et al. .................... 62/184 |
| 6,538,881 B1 | 3/2003 | Jeakins et al. |
| 6,542,360 B2 | 4/2003 | Koizumi |
| 6,587,343 B2 | 7/2003 | Novotny |

\* cited by examiner

HIGH-POWER MULTI-DEVICE LIQUID COOLING

TECHNICAL FIELD

The present invention generally relates to a system and method for cooling electronic components, and in particular, the use of a sliding seal mechanism and/or flexible tubing for connecting a cooling circuit to a heat dissipation structure. A fluid reservoir whose output operates independent of the reservoir's orientation to gravity is also presented.

BACKGROUND ART

Cooling of electronic components is becoming increasingly significant. The trend in integrated circuit (IC) design, and in particular, central processor units (CPUs), is increased speed and circuit density. This increased speed and density, in turn, causes the IC to require more power and generate more heat. Without sufficient cooling, the IC may not perform as specified and may suffer a decrease in reliability.

To cool high-powered electronic components on circuit boards, liquid or refrigerant-cooled systems may be utilized. Typically, the cooling system includes a cooling circuit, which circulates liquid or refrigerant through a heat dissipation structure that is thermally coupled to an electronic component. The circuit board may include a plurality of such high-powered electronic components, with each component thermally coupled to a separate heat dissipation structure through which liquid or refrigerant flows. The heat dissipation structure(s) may be, for example, a cold plate or an evaporator.

Special consideration must be given when coupling the cooling circuit to multiple heat dissipation structures. Electronic component heights are not regular, and can vary considerably. This height variation between electronic components typically translates directly into height variation between the multiple heat dissipation structures. Not only can device heights vary between types of devices, such as a CPU versus a high frequency switching component, but device heights can vary within a class of electronic components. For example, a particular flip-chip package may have a height tolerance of +/−0.02". Hence, a production run of the same board must allow for both device/package tolerances, as well as interconnect height variations between different classes of electronic components.

Adding further to the complexity of coupling the cooling circuit to the heat dissipation structure(s) is that the connection between the cooling circuit and the heat dissipation structure may cause undue stress to the electronic component, the heat dissipation structure, and/or to the interface between the electronic component and the heat dissipation structure. Such stresses may damage the electronic component and/or the heat dissipation structure, or may lead to decoupling of the interface between the electronic component and the heat dissipation structure.

Conventional methods of connecting the cooling circuit to multiple heat dissipation structures include complicated piston arrangements that exert pressure onto the individual heat dissipation structures to maintain good contact pressure, or rely on expandable fluid bladders to make up for height difference in electronic components. While these methods are functional, they are not cost effective or exceptionally reliable fluid handling methodologies. To manufacture multiple pistons is expensive, and the control of individual pressures on the electronic components presents additional engineering challenges. Expandable fluid bladders are also expensive, and furthermore, are susceptible to failure, especially in the bladder mechanism, and typically are not nearly reliable as the electronics they are cooling.

Cooling circuits used in cooling electronic components, or other fluidic circuits, which may be used, for example, in heating or temperature control systems, commonly allow for temperature-driven fluid expansion and/or contraction. For optimal performance, these circuits may also have the capability to remove trapped air from the recirculating fluid, and in doing so, include extra fluid to make up for the displaced air that is removed from the recirculating fluid.

A fluid reservoir is usually provided for this purpose. Most fluid reservoirs are made from a simple tank, where returning fluid enters near the top of the reservoir, and fluid is drawn from the reservoir from the bottom of the tank. In this arrangement, trapped air floats to the surface of the tank, and the air that is removed is automatically displaced by an equivalent volume of water, drawn, via a pump, into the recirculating lines from the bottom of the tank. As the fluid heats and cools, the volume of fluid in the tank increases and decreases respectively, the volume of fluid in the recirculating lines remain constant, and the specific volume (1/density) of the fluid changes with temperature.

Traditional reservoirs work well in an environment where the direction of gravity does not change with respect to the reservoir geometry. That is, the free surface of the fluid always remains in the same orientation with respect to the tank geometry. Because of this the "bottom" and "top" of the tank remains constant with respect to the free surface of the liquid in the reservoir.

In some applications (such as liquid electronics cooling), it is advantageous that the functions of a reservoir be present in the recirculating system when operating in an environment where the direction of gravity can change with respect to reservoir geometry. However, if a traditional reservoir is inverted, the exit line from the reservoir becomes exposed to the air in the tank, filling the recirculating lines with air, and the pumping operation would cease, or at the very least, the recirculating fluid would become highly mixed with the trapped air in the entire system, seriously degrading the system's performance.

SUMMARY OF THE INVENTION

In accordance with a first embodiment of the invention there is provided a fluid reservoir. The fluid reservoir includes a tank that has a volumetric center and that is capable of holding a maximum volume of fluid. Fluid enters the tank through a tank input and exits the tank through a tank output. The tank output has a port through which fluid from the tank enters the tank output. The tank is capable of being filled with a fluid volume that is less than the maximum volume of fluid, such that the port remains immersed in fluid irrespective of tank orientation.

In accordance with another embodiment of the invention, a system for cooling at least one electronic component that is in thermal contact with one or more heat dissipation structures is presented. The system includes a cooling circuit. At least one sliding seal mechanism is coupled to the cooling circuit, the at least one sliding seal mechanism for coupling to at least one of the one or more heat dissipation structures.

In accordance with another embodiment of the invention, a cooling system is presented. The system includes a cooling circuit and at least one electronic component coupled to a surface. One or more heat dissipation structures are in thermal contact with the at least one electronic component. At least one sliding seal mechanism is coupled to the cooling circuit and the one or more heat dissipation structures so as to provide fluid communication between the cooling circuit and the one or more heat dissipation structures.

In accordance with another embodiment of the invention, a cooling system is presented that includes a surface. At least one electronic component is coupled to the surface. One or more heat dissipation structures are in thermal contact with the at least one electronic component. At least one flexible tube is coupled to a cooling circuit and the one or more heat dissipation structures so as to provide fluid communication between the cooling circuit and the one or more heat dissipation structures.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

Figure 1:
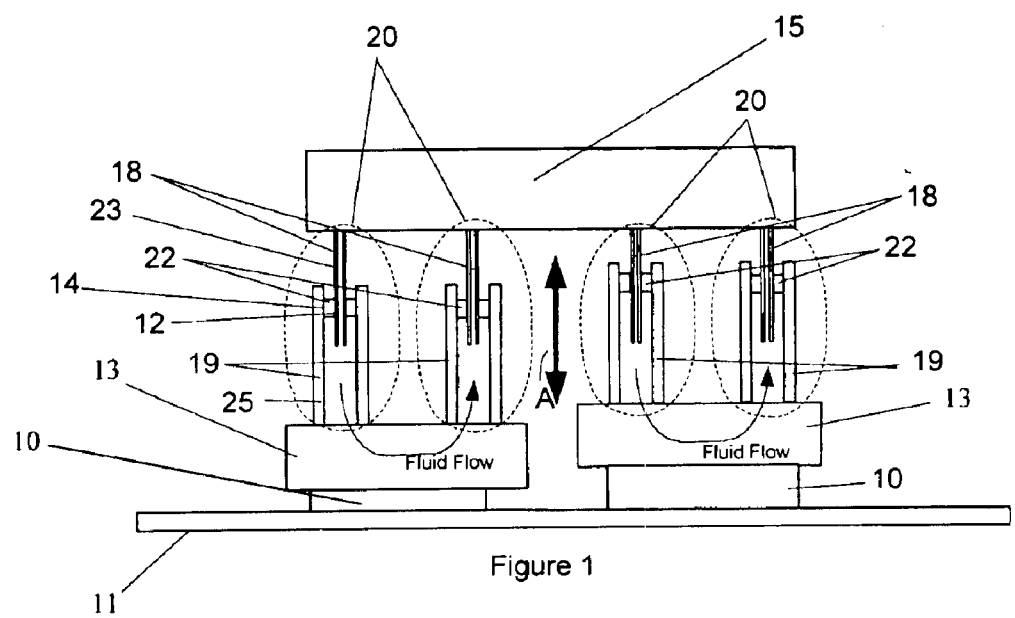
FIG. 1 is a cross-sectional view of a system for cooling at least one electronic component that includes a sliding seal, in accordance with one embodiment of the invention.

FIG. 1 is a cross-sectional view of a system for cooling at least one electronic component 10, in accordance with one embodiment of the invention. Electronic components include electronic devices whose operation involves the motion of electrical charge carriers, such as an integrated circuit. The electronic component(s) 10 may be attached to a surface 11 using, for example, but not limited to, adhesive, soldering, welding, thru hole and surface mount technologies. The surface 11 may be a circuit board.

The at least one electronic component 10 is thermally coupled to one or more heat dissipation structures 13. The heat dissipation structure(s) 13 may include, for example a cold plate. The cold plate may be attached to the at least one electronic component using various technologies known in the art, including, but not limited to, adhesive or mechanical technologies. The cold plate can be made of any suitable material having sufficient heat conductivity such that the heat generated by the electronic component is transferred to the cold plate. Examples of such materials include, but are not limited to, copper, aluminum, and stainless steel. The cold plate typically has both a fluid inlet and a fluid outlet through which a fluid passes. The fluid may be water, water mixed with ethyene glycol, or other flourinerts/fluid coolants known in the art. The transfer of fluid out of the cold plate acts to remove the heat transferred from the at least one electronic component 10 to the cold plate.

In another embodiment, the one or more heat dissipation structure(s) 13 includes an evaporator/expander. Typically, refrigerant liquid at high pressure flows into the evaporator/expander. Refrigerant used may be R134A, however, other refrigerants known in the art may be used. The evaporator/expander includes an expander device, which commonly is an expansion valve. When the fluid flows through the expander device, the liquid refrigerant is moved from a high-pressure zone to a low-pressure zone. This allows the refrigerant to expand and evaporate within the evaporator/expander. As the refrigerant evaporates, its temperature drops. The at least one electronic component 10, which is thermally coupled to the evaporator/expander, passes heat to the vaporized refrigerant, thus cooling the at least one electronic component.

The heat dissipation structure(s) 13 is coupled to a cooling circuit 15, which may be a closed cooling circuit. The cooling circuit 15 may be a fluidic circuit that provides fluid to a cold plate(s). In another embodiment, the cooling circuit 15 may be a refrigerant circuit that provides refrigerant to an evaporator(s)/expander(s).

A fluidic circuit may include, for example, a pump, heat exchanger, and/or a fluid reservoir that acts as an expansion tank. The pump may be, for example, a centrifugal pump, rotary vane pump, turbine pump, piston pump, or other pump as known in the art. The pump may be an enclosed pump wherein the fluid is isolated from the pump's motor. The pump may also be magnetically coupled, which typically increases reliability. Fluid that has been heated by passing through the cold plate is typically received and flows through a heat exchanger. The fluid typically flows through a coil of thin-walled tubes in the heat exchanger. Heat from the fluid is transferred to the tubes, which are then cooled by airflow that may be generated by, for example, a fan or blower. A plurality of cold plates may be coupled to a heat exchanger, with each cold plate coupled to at least one electronic component. A fluid reservoir allows space in the fluidic circuit for fluid expansion and may also aid in trapping air bubbles in the system.

A refrigerant circuit may include, without limitation, a condenser and a compressor. The compressor compresses refrigerant gas. This raises the refrigerant's pressure and temperature. The compressor is coupled, via supply lines, to a condenser. The condenser includes coils that allow the hot refrigerant gas to dissipate heat, the coils typically being cooled by airflow, which may be generated, for example, by a blower or a fan. Upon being cooled, the refrigerant gas condenses into refrigerant liquid at high pressure whereupon it flows into the evaporator/expander. Refrigerant gas is then returned from the evaporator/expander to the compressor, and the cycle repeats.

Tubing is typically used to connect the various elements of the cooling circuit 15. (these elements may include, without limitation, a pump, a heat exchanger, a fluid reservoir, a condenser, and/or a compressor, as described above). The tubing may be made of various materials as known in the art, such as, but not limited to metals and plastics. The elements of the cooling circuit 15 may be coupled to the tubing using, for example, adhesives, and/or glues. Metal components may be attached by welding or soldering the components together.

So as to account for height differences between the one or more heat dissipation structures 13 relative to the surface 11, a sliding seal mechanism 20 couples the cooling circuit 15 to the one or more heat dissipation structures 13. In this manner, a cost effective and reliable manner of connecting the cooling circuit 15 to the heat dissipation structure(s) is provided, while minimizing stress on individual electronic components and/or heat dissipation structures.

In accordance with one embodiment of the invention, the sliding seal mechanism 20 includes a first duct 18 and a second duct 19. The first duct 18 and the second duct 19 may be made of various materials known in the art, including, without limitation, aluminum or plastic tubing. Material compatibility, durability, and useful life should be considered when selecting the duct material.

The first duct 18 and the second duct 19 are coupled together via a sliding seal 22. Sliding seal 22 may include, for example, a rubber O-ring, whose inner surface 12 remains in material contact with the outside surface 23 of the first duct 18, and whose outer surface 14 remains in material contact with the inside surface 25 of the second duct 19. Typically, O-ring is held in place by one of the first duct 18 and second duct 19. This may be accomplished, for example, by inserting the O-ring into a groove located on either first duct 18 or second duct 19.

Axial translations in the direction labeled A in FIG. 1 are allowed between the first duct 18 and the second duct 19, while maintaining a leak free connection between the first duct 18 and the second duct 19. So as to prevent first duct 18 and second duct 19 from separating when attempting to increase the length of the sliding seal mechanism 20 too far, first duct 18 and/or second duct 19 may include a stop/lip. Because axial translations are permitted, the length of the sliding seal mechanism 20 can be adjusted so as to accommodate different device 10 heights when coupling the cooling circuit 15 to the one or more heat dissipation structures 13. Additionally, the freedom of movement allowed by the sliding seal 22 can reduce coupling stresses generated on the sliding seal mechanism 20, heat dissipation structure 13, cooling circuit 15 and/or device 10.

The first duct 18 is coupled to the cooling circuit 15, while the second duct 19 is coupled to at least one of the one or more heat dissipation structures 13. The first duct 19 and the second duct are made of sufficient length so as to accommodate, via the sliding seal 20, height variations between the fluid circuit and the one or more heat dissipation structures 13. The ducts 18 and 19 may be connected to the cooling circuit and heat dissipation structure, respectively, by using, without limitation, clamps, adhesives, and/or glues. Metal components may be attached by welding or soldering the components together.

Figure 2:
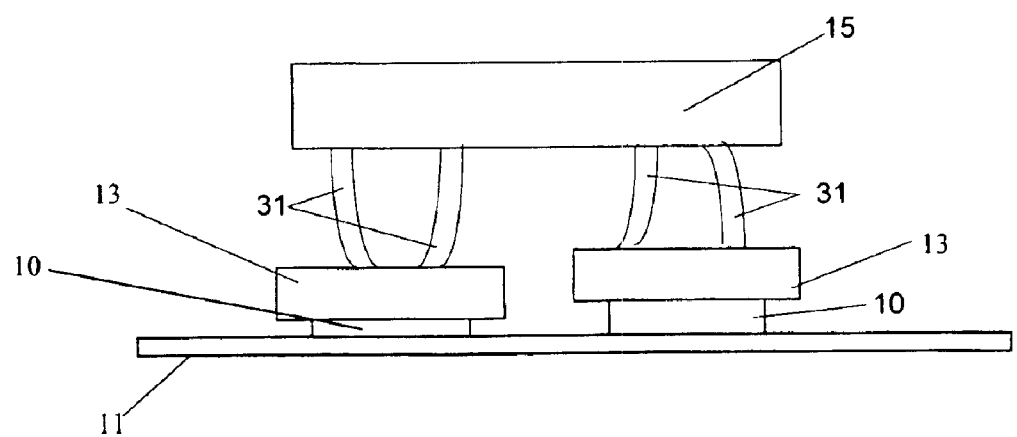
FIG. 2 is a side view of a system for cooling at least one electronic component that includes flexible tubing, in accordance with one embodiment of the invention.

In accordance with another embodiment of the invention, instead of a sliding seal mechanism, flexible tubing 31 is used to connect the cooling circuit 15 to at least one of the one or more heat dissipation structures 13, as shown in FIG. 2. The flexible tubing remains, or is flexible enough during the assembly process to allow for variation in device heights and/or locations. Material of the flexible tubing 31 may be plastic such as PVC or polyurethane, metal such as copper, aluminum or stainless steel, or other suitable material compatible with refrigerant, ethylene glycol and/or water. The flexible tubing may be coupled to the cooling circuit 15 and/or the heat dissipation structure(s) 13 using, without limitation, hose fittings, clamps, and/or compression fittings.

Figure 3:
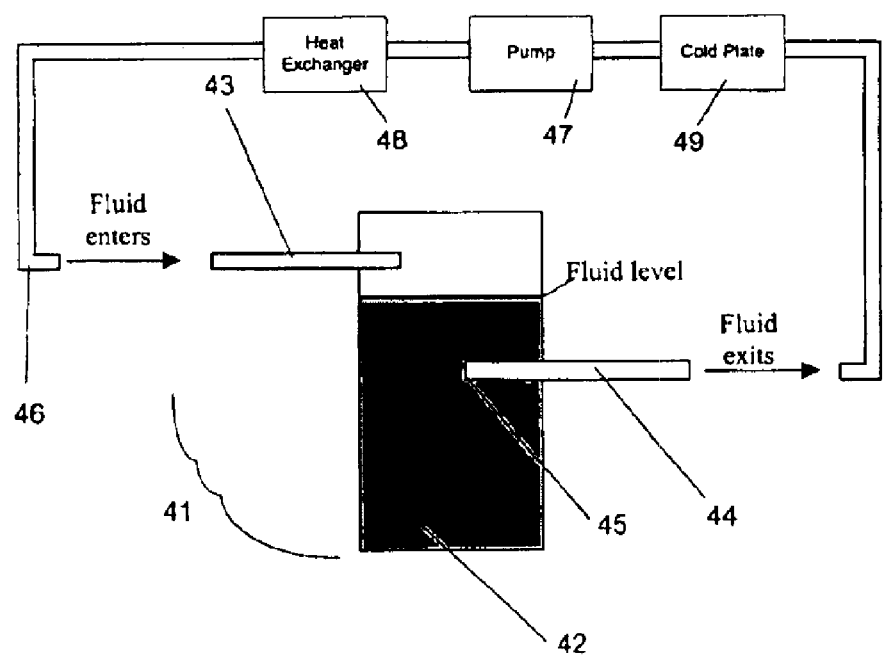
FIG. 3 is a schematic of a fluid reservoir, in accordance with one embodiment of the invention.

FIG. 3 shows a fluid reservoir 41 in accordance with one embodiment of the invention. The fluid reservoir functions irrespective of the reservoir's orientation with respect to, for example, the direction of gravity. The fluid reservoir 41 may be advantageously used in a fluidic circuit to allow space in a fluidic circuit for temperature driven fluid expansion and contraction and may also aid in trapping air bubbles in the system. The reservoir 41 may be used, without limitation, in domestic heating systems, automotive cooling circuits, laboratory instrument temperature control systems, electronics, and many other diverse applications where fluid reservoirs are employed.

The fluid reservoir 41 includes a tank 42 that has a volumetric center and is capable of holding a maximum volume of fluid. The tank 42 may be made of metal, plastic, or other suitable material. The tank has both a tank input 43 and a tank output 44. Fluid enters the tank through the tank input 43 and exits the tank 42 through the tank output 44. The tank input 43 and output 44 may be coupled to, for example, a fluidic circuit 46, which may be a closed fluidic circuit in which fluid recirculates. As discussed above, the fluidic circuit may include, without limitation, a pump 47, a cold plate 49, and/or a heat exchanger 48. In other embodiments, the fluid input 43 and output 44 may be coupled to a refrigerant circuit.

The tank output 44 has a port 45 through which fluid within the tank 42 enters the tank output 44. Port 45 may be of various shape and sizes, including, without limitation, circular, rectangular, or square.

Tank 42 is capable of being filled with a fluid volume that is less than the maximum volume of fluid, such that the port 45 remains immersed in fluid irrespective of tank orientation. Any trapped gases in the reservoir 41 can float to the free surface of the fluid in the reservoir 41, while still maintaining a flooded condition at the port 45.

For example and without limitation, port 45 may be positioned within the tank 42, at a position substantially near the volumetric center of the tank 42. The tank 42 can then be filled with a total amount of fluid that is equal to half the maximum volume of the tank 42 plus a relatively small percentage of the maximum volume required to ensure the outer perimeter of the port 45 is immersed in fluid irrespective of tank 42 orientation. In various embodiments, based at least in part on the maximum distance between the outer perimeter of the port 45 and the volumetric center, and also on the maximum volume of tank 42, the total amount of fluid needed to ensure immersion of the port may be between, without limitation, 50% and 60% of the maximum volume of tank 42. Expansion or contraction of the fluid over the entire operating temperature range of the closed fluidic circuit should also be taken into account when determining the amount of fluid in the circuit needed to ensure immersion of port 45.

Port 45 may be positioned within the tank 42 at positions other than the volumetric center. As the distance between port 45 and the volumetric center of the tank 42 increases, the amount of fluid required to fill tank 42, to ensure flooding of port 42 regardless of tank orientation, increases.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

What is claimed is:

1. A system for cooling at least one electronic component, the at least one electronic component in thermal contract with one or more heat dissipation structures, the cooling system comprising:

a cooling circuit having a fluid reservoir, the fluid reservoir including:

a tank capable of holding a maximum volume of fluid, the tank having a port through which fluid from the tank having a volumetric center;

a tank input through which fluid enters the tank; and a tank output through which fluid exists the tank, the tank output having a port through which fluid from the tank enters the tank output, the tank capable of being filled with a fluid volume which is less than the maximum volume of fluid, such that the port remains immersed in fluid irrespective of tank orientation; and at least one sliding seal mechanism coupled to the cooling circuit, the at least one sliding seal mechanism for coupling to at least one of the one or more heat dissipation structures.

2. The system according to claim 1, wherein the cooling circuit includes one of the refrigeration circuit and a fluidic circuit.

3. The system according to claim 1, wherein the one or more heat dissipation structures includes one of an evaporator and a cold plate.

4. The system according to claim 1, wherein the at least one sliding seal mechanism includes:

a first duct coupled to the cooling circuit; and a second duct coupled to the first duct via a sliding seal, the second duct for coupling to at least one of the one or more heat dissipation structures.

5. A cooling system comprising:

a surface;

at least one electronic component coupled to the surface;

one or more heat dissipation structures in thermal contact with at least one electronic component;

a cooling circuit including a fluid reservoir, the fluid reservoir including:

a tank capable of holding a maximum volume of fluid, the tank having a port through which fluid from the tank enters the tank output, the tank capable of being filled with a fluid volume which is less than the maximum volume of fluid, such that the port remains immersed in fluid irrespective of tank orientation;

at least one sliding seal mechanism coupled to the cooling circuit and the one or more heat dissipation structures so as to provide fluid communication between the cooling circuit and the one or more heat dissipation structures.

6. A cooling system comprising:

a surface;

at least one heat dissipation structures in thermal contact with the at least one electronic component;

a cooling circuit including a fluid reservoir, the fluid reservoir including:

a tank capable of holding a maximum volume of fluid, the tank having a volumetric center;

a tank input through which fluid enters the tank; and a tank output through which fluid exits the tank, the tank output having a port through which fluid from the tank enters the tank output, the tank capable of being filled with a fluid volume which is less than the maximum volume of fluid, such that the port remains immersed in fluid irrespective of tank orientation; and at least one flexible tube coupled to the cooling circuit and the one or more heat dissipation structures so as to provide fluid communication between the cooling circuit and the one or more heat dissipation structures.

* * * * *